United States Patent [19]

Uratsuji

[11] Patent Number: 5,195,903
[45] Date of Patent: Mar. 23, 1993

[54] SOCKET FOR ELECTRIC PART
[75] Inventor: Kazumi Uratsuji, Tokyo, Japan
[73] Assignee: Yamaichi Electric Co., Ltd., Tokyo, Japan
[21] Appl. No.: 810,292
[22] Filed: Dec. 19, 1991
[30] Foreign Application Priority Data
  Dec. 25, 1990 [JP] Japan .................................. 2-413749
[51] Int. Cl.$^5$ .............................................. H01R 11/22
[52] U.S. Cl. ..................................... 439/266; 439/331
[58] Field of Search ....................... 439/70, 71, 72, 73, 439/259–264, 266–270, 331

[56] References Cited
U.S. PATENT DOCUMENTS

| 4,623,208 | 11/1986 | Kerul et al. | |
|---|---|---|---|
| 4,886,470 | 12/1989 | Billman et al. | 439/266 |
| 4,993,955 | 2/1991 | Savant | 439/73 |
| 5,009,609 | 4/1991 | Matsuoka et al. | 439/73 |

Primary Examiner—Larry I. Schwartz
Assistant Examiner—Khiem Nguyen
Attorney, Agent, or Firm—Wenderoth, Lind & Ponack

[57] ABSTRACT

A socket is disclosed in which a contacting portion of a contact can be displaced outwardly in order to facilitate an easy insertion or removal of an electric part such as an IC. A contacting portion of a contact is displaced inwardly in order to obtain an electrical contact between a contacting point of the electric part and the contacting portion. The contact includes a hook-shaped latch portion extending in a direction opposite the contacting portion and extending downwardly. An acting portion of a pivotal lever is brought into contact engagement with an inner surface of the hook-shaped latch portion, and the acting portion exerts an outward tensile force against the latch portion of the pivotal lever while being pivoted in the inner surface of the hook portion. This causes outward displacement of the contacting portion such that the contacting portion is removed from the contacting point of the electric part.

5 Claims, 4 Drawing Sheets

SOCKET FOR ELECTRIC PART

BACKGROUND OF THE INVENTION

1. Field of the Invention

This invention relates to a zero load insertion type socket for an electric part having means for displacing a contact between a contacting position and a releasing position.

2. Brief Description of the Prior Art

A conventional socket as represented by U.S. Pat. No. 4,623,208 has a cantilevered arm which is integral with a contact and extends outwardly therefrom, and a curved spring portion likewise integral with the contact. The curved spring portion is compressed when the cantilevered arm is pushed down by a presser cover, to create an outward displacement as a component force, thereby separating a contacting portion of the contact from a contacting point of an IC, so that the IC can be inserted or removed with no-load.

In the prior art mentioned above, the necessary operating force for pushing down the pressure cover and the contacting force of the contact are determined by the spring portion of the contact.

Therefore, if a spring constant is set large in order to increase the contacting force, the necessary operating force is also increased. On the contrary, if a spring constant of the spring portion is set small in order to reduce the necessary operating force, the contacting force is also reduced. Thus, the prior art socket the inherent disadvantage that it is difficult to provide a design therefor which allows both the necessary operating force to be reduced as much as possible and the contacting force to be increased.

In a structure wherein a spring portion is compressed by pushing down a cantilevered arm in order to obtain an outward displacing motion, the amount of outward displacement caused by the downwardly directed force is very limited. Therefore, it is difficult to obtain outward displacement efficiently with respect to the amount of downward pressing necessary.

Additional problems are that when the cantilevered arm is pushed down, the axis of the contact tends to be twisted, which will likely result in a harmful displacement of the contacting portion, and metal fatigue tends to accumulate in the basal portion of the cantilevered arm because of repeated applications of external force in the bending direction.

Furthermore, the conventional contact is subjected to complicated and highly technical designing constraints, such as providing the cantilevered arm with a sectional area sufficient in order to give it a predetermined strength, establishing the above-mentioned spring constant, providing counter measures against twisting, and the like.

SUMMARY OF THE INVENTION

It is therefore an object of the present invention to provide a socket for an electric part in which the amount of downward operating force necessary can be reduced and a contacting force can be increased.

Another object of the present invention is to provide a socket for an electric part in which outward displacement can be efficiently obtained upon a push-down action, and therefore, a sufficient amount of outward displacement can be obtained with a limited amount of downward pressing.

A further object of the present invention is to provide a socket for an electric part which is capable of more effectively solving such problems as twisting of the contact caused by push-down operations and metal fatigue of a cantilevered arm, and in which the contact can be reliably displaced even after repeated use.

To solve the above objects, there is essentially provided a socket for an electric part including a space for accommodating an electric part, and a plurality of contacts arranged in parallel relation along at least two opposing sides of the electric part accommodating space. Each of the contacts is provided with a contacting portion for contacting with a contacting point of the electric part accommodated within the electric part accommodating space, and a spring portion adapted to urge the contacting portion inwardly to obtain a contacting pressure against the contacting point of the electric part. The socket for an electric part further includes a pivotal lever pivotably supported along the external side of the rows of contacts for vertical pivotal movements about a fixed fulcrum. The pivotal lever has an operating portion at one thereof which is adapted to pivot the lever in a vertical direction, and an acting portion at the other end which is adapted to transmit an outward force to the contact. The contact has a hook-shaped latch portion extending in an opposite direction with respect to the contacting portion, and the latch portion is engaged with the acting portion. The operating portion of the pivotal lever is urged into an upper pivotal position by the spring portion of the contact. The acting portion exerts an outward tensile force against the hook-shaped latch portion upon a downward pivotal movement of the operating portion, in order to displace the contacting portion of the contact outwardly against the resiliency of the curved spring portion so as to be separated from the contacting point of the electric part.

The above invention is advantageously applicable to a socket of the type in which a contact is displaced in the contacting direction (inward displacement) by a spring portion.

In the above-mentioned socket for an electric part, a downward force is exerted against the operating portion of the pivotal lever. The operating portion can be pushed down directly by a robot or a finger. Otherwise, a vertically movable presser cover as in the prior art is provided for the socket, and by pushing down the presser cover by means of a robot or a finger, the pivotal lever can be pushed down indirectly. When the operating portion is pushed down, the pivotal lever is pivoted downwardly about an axis parallel to the row of contacts, and in association with the foregoing movement, the acting portion exerts an outward tensile force against the contact while being pivoted in the inner surface of the hook-shaped latch portion. As a result, the contacting portion of the contact is displaced outwardly against the resiliency of the spring portion and is separated from the contacting point of the electric part accommodated with the electric part accommodating space in order to order to allow the electric parts to be removed. As accordingly, the electric part can be removed or inserted under no load.

Upon removal of the downward force exerted on the operating portion of the pivotal lever is pivoted upwardly by the resiliency of the spring portion as exerted against the acting portion through the latch portion, such that the lever is placed in a standby state for the next push-down operation. At the same time, the contact is displaced inwardly by the spring portion and is brought into pressure contact with the contacting point of the electric part.

In the above-mentioned socket for an electric part, the spring portion of the contact can be set to have a spring constant which will allow it to contact the contacting point of the electric part with an appropriate contacting force. On the other hand, the pivotal member can be pushed down with a reduced operating force because of the principles of the lever. The use of a large spring constant for the spring portion of the contact will, however, not lead directly to an increase in the necessary push-down operating force. By appropriately establishing the distances between the pivotal fulcrum of the pivotal lever to the operating portion and the acting portion, the above-mentioned operating force can be reduced. At the same time, the object of increasing the contacting force can also be achieved.

Furthermore, since the acting portion of the pivotal lever exerts an outward tensile force against the contact in the direction in which the contact is to be displaced so that it is separated from the contacting point of the electric part, the contact can efficiently be displaced outwardly with respect to the downward force necessary against the pivotal lever, and the electric part accommodating space can be properly opened.

Moreover, twisting and accumulation of metal fatigue in the cantilevered arm will not occur as in the prior art when the cantilevered arm of the contact is pushed down such that the contact can be reliably displaced even after it has been used repeatedly. In addition, the acting portion of the pivotal lever exerts a tensile force while being freely pivoted in the inner surface of the latch portion, and the tensile of the contact and rearward displacement thereof are smoothly and properly realized by the pivotal movement of the pivotal lever.

The above and other objects and features of the present invention will be better understood from the following description of the preferred embodiment with reference to the drawings.

DETAILED DESCRIPTION OF THE EMBODIMENT

Figure 1:
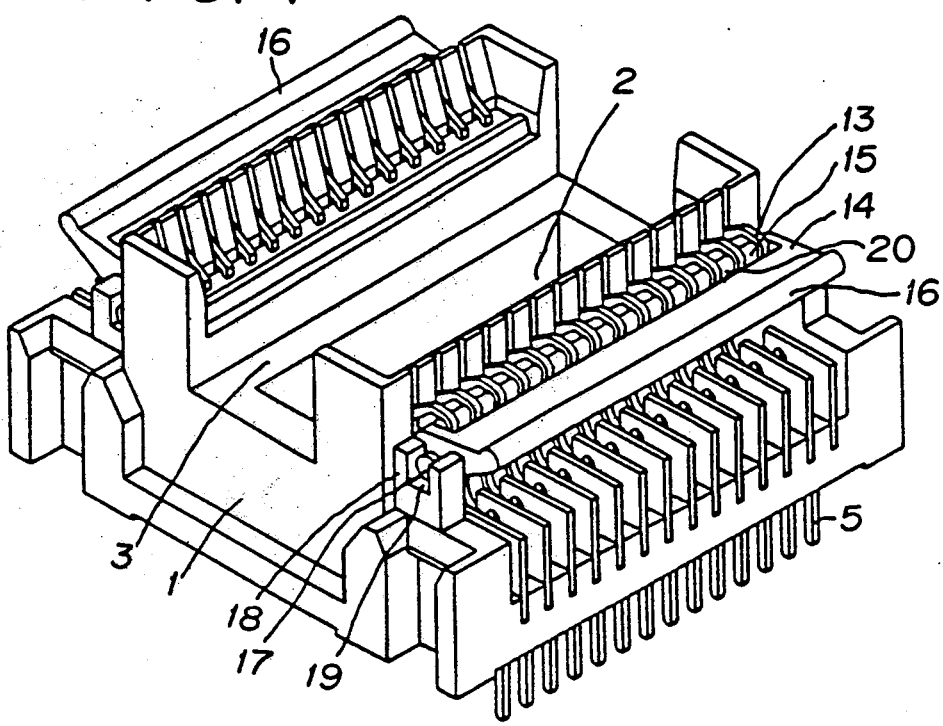
FIG. 1 is a perspective view showing a socket for an electric part according to one embodiment of the present invention.

One embodiment of the present invention will be described in detail with reference to FIGS. 1 through 4.

A base member 1 formed of an insulating material has a central opening 2 which opens through upper and lower surfaces. An electric part accommodating space 3 is defined at the upper portion of the central opening 2, and a plurality of contacts 4 are arranged in parallel relation along at least two opposing sides of the accommodating space 3.

The contacts 4 are implanted in the base member 1. Each contact 4 has a male terminal 5 projecting downward from the lower surface of the base member 1, and a plane portion 6 continuously leading to a basal portion of the mail terminal 5. The plane portion 6 is supported on and extends vertically upwardly from an upper surface of an implanting wall of the contact 4. A spring portion 7 is provided and extends from an inner edge of an upper end of the plane portion 6. The spring portion 7 is formed into a curved configuration extending downwardly from a continuous portion (basal portion 8) between the spring portion 7 and the plane portion 6 and then extending upwardly to the vicinity of the continuous portion (basal portion 8). That is, the spring portion 7 is formed into a curved configuration facing downward, and its angle of curvature is such that a small space 10 is formed between the basal portion 8 and a front end 9 extending from the basal portion 8 so that the spring portion 7 is opened at an upper part thereof. The angle of curvature is 180° or more and preferably 250° or more. In other words, the spring portion 7 is curved such that the front end 9 thereof reaches the vicinity of an upper end of a vertical center line Y thereof. The curved spring portion 7 is provided with a contacting arm 11 which extends continuously to the front end 9 and is inclined inwardly. The contacting arm 11 is provided with a contacting projection 12 extending continuously to the front end thereof and projecting inwardly and facing downwardly.

Figure 3A:
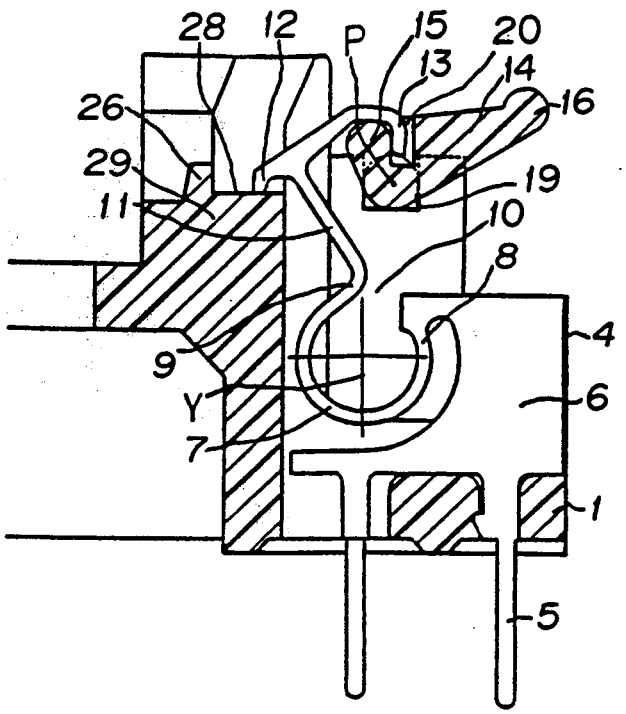
FIG. 3(A) is a sectional view of an important portion of the socket for an electric part, showing a pivotal lever and a contact in an inwardly displaced state.
Figure 4A:
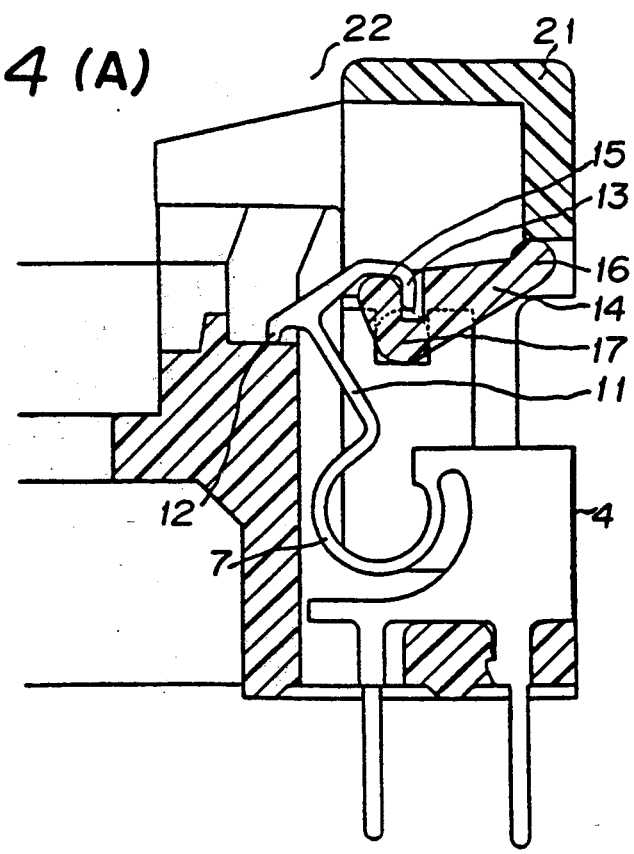
FIG. 4(A) is a sectional view of an important portion of the socket of FIGS. 3(A)–3(C), but with a presser cover therefor.

As shown in FIGS. 3(A) and 4(A), the spring portion 7 acts such that the contacting arm 11 and the contacting projection 12 are urged inwardly so as to be contacted with a contacting point 25 of an electric part 23. Further, the arm 11 is provided with a latch portion 13 extending upwardly at angles from the front end thereof, i.e., from the continuous portion of the contacting projection 12. The latch portion 13 has a hook-shape formed by bending a free end thereof downwardly. A pivotal lever is provided which has an acting portion 15 at one end and an operating portion 16 at the other end. The acting portion 15 of the pivotal lever 14 is engaged with an inner surface of the hook-shaped latch portion 13. The latch portion 13 and the contacting projection 12 are formed at a free end of the contact and extend in opposite directions.

As shown in FIG. 1, the pivotal lever 14 is elongated in parallel relation with the row of contacts 4 and is disposed mostly outwardly of the contacting arm 11. The operating portion 16 is formed on the end of the pivotal lever 14 in such a manner as to extend outwardly therefrom, and the acting portion is formed on the other end is adapted to engage with the latch portion 13. The pivotal lever 14 is vertically pivotable about an axial line P which is parallel to the row of contacts 4, and is provided with a shaft portion 17 extending along the axial line P from both ends of the lever for pivotably supporting the lever 14. The shaft portion 17 is rotatably supported on a bearing portion 18. The bearing portion 18 defines a recess portion 19 opening upwardly, and the shaft portion 17 is slidably fitted into the recess portion 19, so that the pivotal lever 14 can be removed upwardly from the recess portion 19 or can be fitted into the recess portion 19 from above.

An engaging groove 20 extending in parallel relation with the row of contacts 4 is formed in the upper surface of the acting portion 15. By slightly loosely inserting the hook-shaped latch portion 13 of the contact 4 into the engaging groove 20, the acting portion 15 can be brought into engagement with the inner surface of the latch portion 13 in order to exert an outward force thereto. That is, the latch portions 13 of one row of contacts is engaged with the engaging groove 20 of one lever 14. In this manner, the contacts 4 and the pivotal lever 14 are engaged without being integrally connected.

Figure 2:
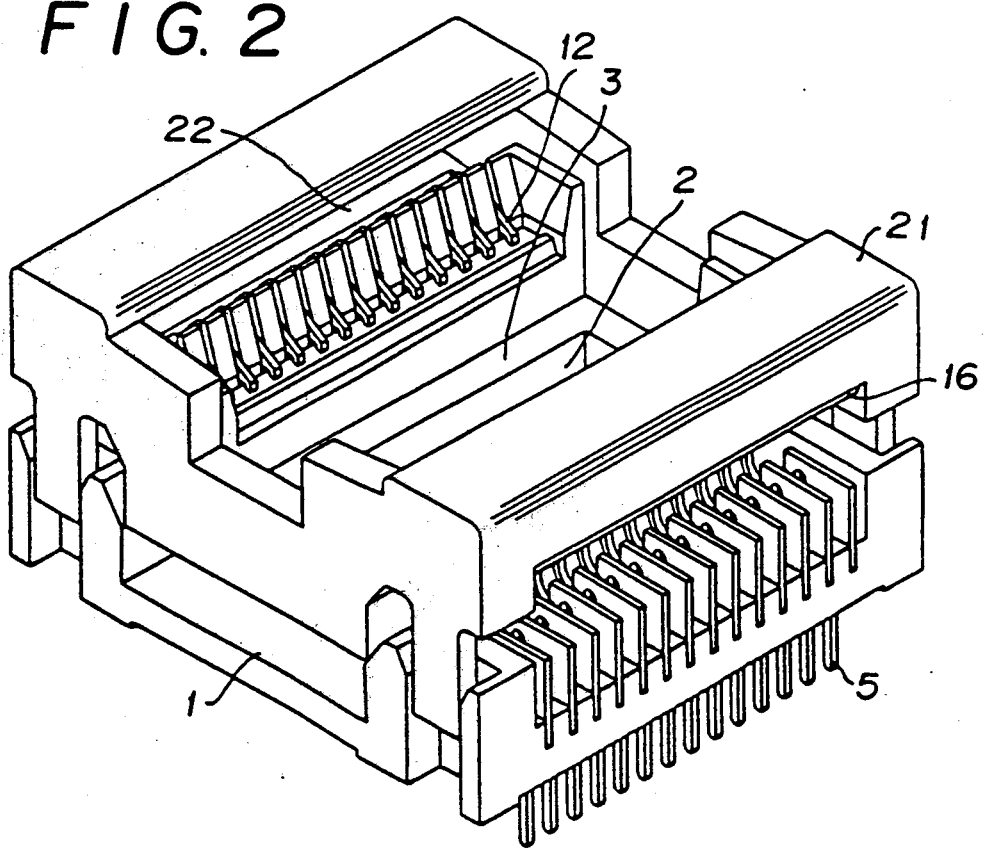
FIG. 2 is a perspective view showing the socket with a presser cover thereon.
Figure 3B:
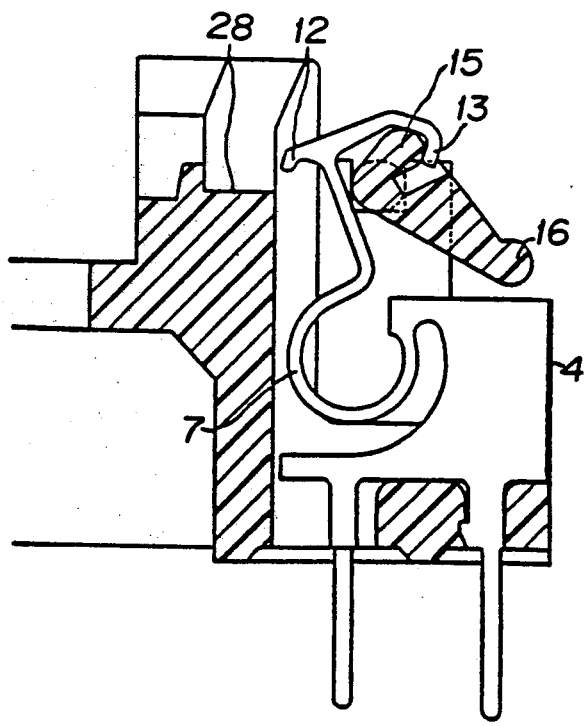
FIG. 3(B) shows the socket portion of FIG. 3(A), but with the contact and the pivotal lever in an outwardly displaced state.
Figure 3C:
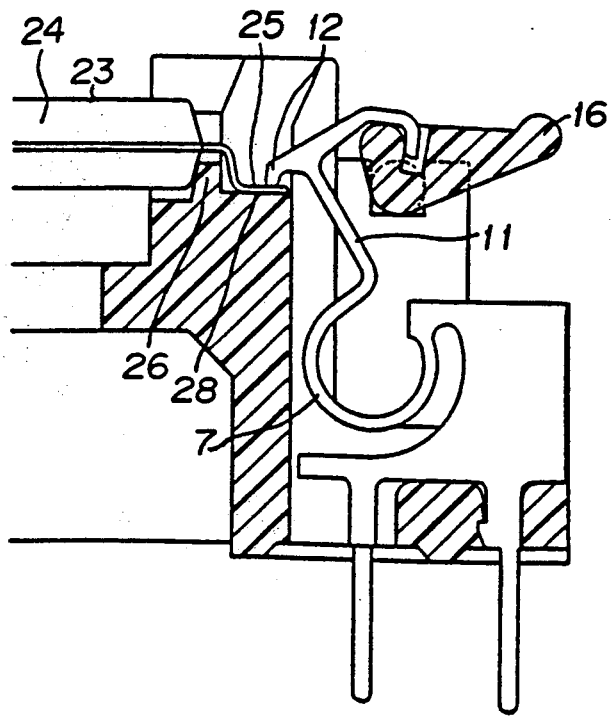
FIG. 3(C) shows the socket portion of FIG. 3(A), but with an electrical part mounted therein.
Figure 4B:
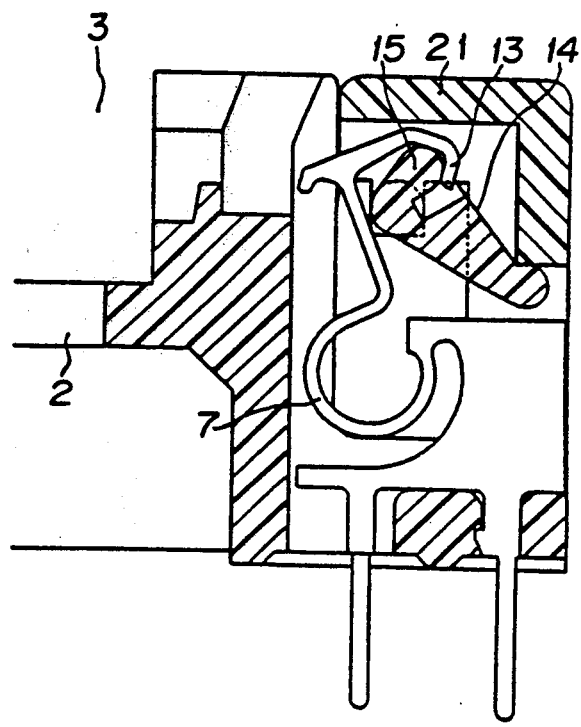
FIG. 4(B) shows the socket portion with the presser cover of FIG. 4(A), but with the pivotal lever and the contact in an outwardly displaced state.
Figure 4C:
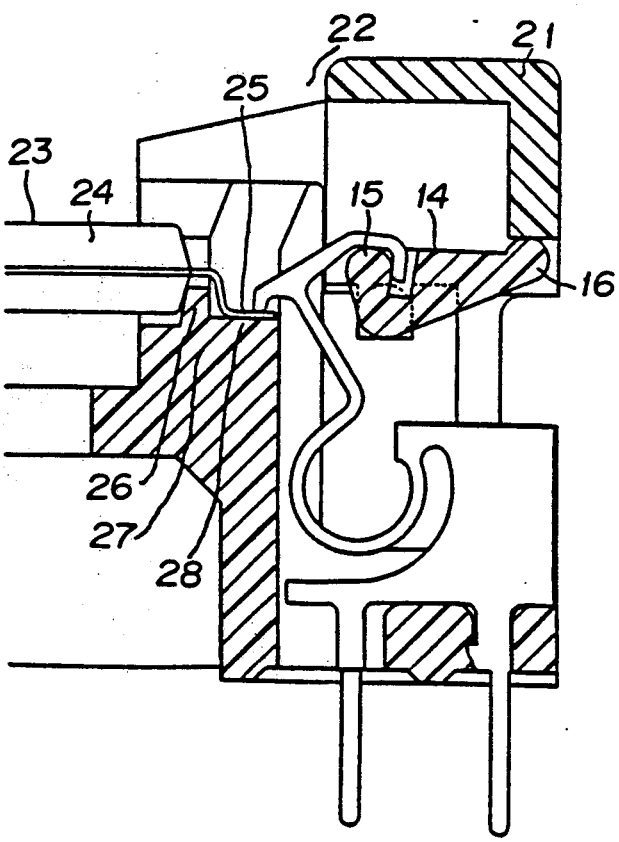
FIG. 4(C) shows the socket portion with the presser cover of FIG. 4(A), but with an electric part mounted therein.

The pivotal lever 14 is formed of an insulating material and include the above-mentioned elements 15, 16, 20, and 17. The pivotal lever 14 is supported for pivotal movement about the axial line P so that it is pivoted about a fixed fulcrum as mentioned above. As shown in FIGS. 1 and 3, the operating poriton 16 can be pushed down directly by a robot or by manual operation, without a provision of a presser cover. Also, as shown in FIGS. 2 and 4, a presser cover 21 can be disposed over the base member 1. A central window 22 of the presser cover 21 is aligned with the electric part accommodating space 3 of the base member 1 so that the electric part 23 can be inserted into and removed from the accommodating space 3 through the central window 22. By pushing down the presser cover 21 against the operating portion 16 of the pivotal lever 14, the lever 14 is caused to be pivoted against the resiliency of the spring portion 7. The electric part 23, which is here represented by an IC, has the contacting points 25 projected sideways (outwardly) therefrom.

As described above, the operating portion 16 of the contact 4 is either pushed down directly by a robot or by manual operation, or the lower surface of the presser cover 21 is brought into contact with the operating portion 16 of the pivotal lever 14 and the presser cover 21 is pushed down by a robot or by manual operation to push down the operating portion 16. As a result, the pivotal lever 14, as shown in FIGS. 3(B) and 4(B), is pivoted downwardly about the shaft portion 17. In association with the downward movement of the pivotal lever 14, the acting portion 15 pulls the latch portion 13 of the contact 4 outwardly while being pivoted in the inner surface of the latch portion 13. By this outward tensile force, the contact 4 is displayed outwardly against the resiliency of the spring portion 7 so as to be moved away to a position where the contact 4 does not interfere with the contacting piece 25 of the electric part 23. Accordingly, the electric part 23 can be inserted into the accommodating space 3 under no load or can be removed from the accommodating space 3 under no load.

When the push-down force exerted against the operating portion 16 is removed, the latch portion 13 exerts an inward tensile force against the acting portion 15 due to the resiliency of the spring portion 7. Due to this inward tensile force against the acting portion 15, the lever is pivoted such that the operating portion 16 is moved upwardly while the acting portion is pivoted in the inner surface of the hook-shaped latch portion 13, to thereby place the lever in a standby state for the next push-down operation. At the same time, the contacting arm 11 and contacting projection 12 of the contact 4 are urged and displaced inwardly by the spring portion 7 and bought into pressure contact with the upper surface of the contacting point 25 of the electric part 23.

A wall 27 defining the electric part accommodating space 3 is provided with a positioning ridge 26 projecting upward therefrom. The side surface of the electric part 24 is supported by the positioning ridge 26, and the lower surface of the contacting point 25 is supported by a contacting point supporting surface 28 formed on the upper surface of the wall 27 at an outer side of the positioning ridge 26. The contacting projection 12 is brought into pressure contact with the upper surface of the contacting point 25 when the contacting point is in the foregoing supported state, by the downwardly directed resilient force of the spring portion 7.

When the electric part 23 is already removed as shown in FIGS. 3(A) and 4(A), the contacting projection 12 is abutted against the contacting point supporting surface 28, so that the contact 4 will not be displaced inwardly beyond a predetermined amount. That is, the contacting point supporting surface 28 forms a stopper for limiting an inward displacing amount of the contact 4. As a result, the operating portion 16 of the pivotal lever 14 is normally pivoted upwardly to a predetermined position and held in a standby state.

According to the present invention, the spring portion of the contact can be provided with a spring constant which will enable it to contact the contacting point of the electric part with an appropriate contacting force, and the contact can be freely designed without being limited by the necessary operating force of the pivotal lever. On the other hand, the pivotal lever can be pushed down with a reduced force because of the principles of lever, and even if the spring constant of the spring portion of the contact is set large, this does not lead directly to an increase in the necessary push-down force. By appropriately establishing distances from the pivotal fulcrum of the pivotal lever to the operating portion and acting portion, the above-mentioned operating force can be reduced. As a result, there can be achieved the object for obtaining a large amount of contacting force with a reduced operating force.

Since the acting portion of the pivotal lever separates the contact from the contacting point of the electric part by incurring a tensile force in the direction in which the contact is displaced, the contact can efficiently be displaced outwardly upon the push-down operation of the pivotal lever with the result that a sufficient space for accommodating the electric part is obtained. Twisting of the contact caused by push-down operations of the cantilevered arm as in the prior art and accumulation of metal fatigue in the cantilevered arm can effectively be prevented, and the contact can be reliably displaced even after repeated use.

Furthermore, the operating portion of the pivotal lever exerts a tensile force against the latch portion while being pivoted in the inner surface of the hook-shaped latch portion thereof and converts, properly and smoothly, the pivotal motion of the pivotal lever to the tensile action or outward displacing action of the contact. As a result, the contacting portion of the contact can smoothly be displaced rearwardly. In addition, when the hook-shaped latch portion is forced outwardly by the pivotal lever, the downwardly curved spring portion is bent in such a manner as to favorably narrow the upper opening in response to the tensile force and cause the contacting portion to be efficiently displaced outwardly. The tensile force for biasing the spring portion can also be reduced.

I claim:

1. A socket for an electric part including an accommodating space for accommodating an electric part, and a plurality of contacts arranged in parallel relation to form rows of contacts along at least two opposing sides of said accommodating space, each of said contacts being provided with a contacting portion to be contacted with a contacting point of the electric part accommodated within said accommodating space, and a curved spring portion adapted to urge said contacting portion inwardly to obtain a contacting pressure with said contacting point of said electric part, wherein said socket further includes a pivotal lever pivotably supported along an external side of each of said rows of contacts for vertical pivotal movements about a fixed fulcrum, said pivotal lever having an operating portion formed on one end thereof and adapted to be operated to cause pivotal movement of said lever in a vertical direction, and an acting portion formed on the other end and adapted to exert an outward force against said contact, said contact having a latch portion which extends away from said spring portion in an opposite direction with respect to said contacting portion and which has a free end bent downwardly to form a hook portion, said hook portion of said latch portion being engaged with said acting portion, said operating portion of said pivotal lever being urged into an upper pivotal position by said spring portion of said contact, said acting portion exerting an outward tensile force to said hook portion of said latch portion upon a downward pivotal movement of said operating portion, in order to displace said contacting portion of said contact outwardly against a resiliency of said curved spring portion so as to separate said contacting portion away from the contacting point of the electric part.

2. A socket for an electric part as claimed in claim 1, wherein said curved spring portion of said contact has a configuration which is curved downwardly and opens upwardly at an upper part thereof.

3. A socket for an electric part including an accommodating space for accommodating an electric part, and a plurality of contacts arranged in parallel relation to form rows of contacts along at least two opposing sides of said accommodating space, each of said contacts being provided with a contacting portion to be contacted with a contacting point of the electric part accommodated within said accommodating space, and a curved spring portion adapted to urge said contacting portion inwardly to obtain a contacting pressure with said contacting point of said electric part, wherein said socket further includes a pivotal lever pivotably supported along an external side of each of said rows of contacts for vertical pivotal movements about a fixed fulcrum, said pivotal lever having an operation portion formed on one end thereof and adapted to be operated to cause pivotal movement of said lever in a vertical direction, and an acting portion formed on the other end and adapted to exert an outward force against said contact, said contact having a latch portion which extends away from said spring portion in an opposite direction with respect to said contact portion such that said latch portion is spaced away from said contacting portion and from said curved spring portion, said latch portion being engaged with said acting portion and said acting portion being disposed outside of said curved spring portion, said operating portion of said pivotal lever being urged into an upper pivotal position by said spring portion of said contact, said acting portion exerting an outward tensile force to said latch portion upon a downward pivotal movement of said operating portion, in order to displace said contacting portion of said contact outwardly against a resiliency of said curved spring portion so as to separate said contacting portion away from the contacting point of the electric part.

4. A socket for an electric part as claimed in claim 3, wherein said curved spring portion of said contact has a configuration which is curved downwardly and opens upwardly at an upper part thereof.

5. A socket for an electric part as claimed in claim 3, wherein a free end of said latch portion is bent downwardly to form a hook portion, and said acting portion is in engagement with said hook portion.

* * * * *